(12) United States Patent
Bozano et al.

(10) Patent No.: US 8,426,113 B2
(45) Date of Patent: Apr. 23, 2013

(54) CHEMICALLY AMPLIFIED SILSESQUIOXANE RESIST COMPOSITIONS

(75) Inventors: Luisa Dominica Bozano, Los Gatos, CA (US); Blake W. Davis, Hollister, CA (US); Alshakim Nelson, Fremont, CA (US); Jitendra Singh Rathore, Campbell, CA (US); Linda Karin Sundberg, Los Gatos, CA (US)

(73) Assignee: International Business Machines Corporation, Armonk, NY (US)

( * ) Notice: Subject to any disclaimer, the term of this patent is extended or adjusted under 35 U.S.C. 154(b) by 235 days.

(21) Appl. No.: 12/856,338

(22) Filed: Aug. 13, 2010

(65) Prior Publication Data

US 2012/0040289 A1    Feb. 16, 2012

(51) Int. Cl.
  *G03F 7/075* (2006.01)
  *G03F 7/038* (2006.01)
  *G03F 7/20* (2006.01)
  *G03F 7/30* (2006.01)
  *G03F 7/40* (2006.01)

(52) U.S. Cl.
  USPC ........... 430/311; 430/325; 430/328; 430/330; 430/331; 430/905; 430/919; 430/920; 430/921; 430/923; 430/925; 430/942

(58) Field of Classification Search .................. None
  See application file for complete search history.

(56) References Cited

U.S. PATENT DOCUMENTS

| | | |
|---|---|---|
| 6,770,726 B1 | 8/2004 | Arkles et al. |
| 7,129,370 B2 | 10/2006 | Yamahiro et al. |
| 7,563,917 B2 | 7/2009 | Yamahiro et al. |
| 7,651,829 B2 | 1/2010 | Hamada et al. |
| 2008/0199789 A1 | 8/2008 | Abdalla et al. |
| 2009/0189317 A1 | 7/2009 | Sato et al. |
| 2009/0251652 A1* | 10/2009 | Kojima et al. ................. 349/138 |

OTHER PUBLICATIONS

Nelson et al., U.S. Appl. No. 12/575,515 for Photo-Patternable Dielectric Materials Curable to Porous Dielectric Materials, Formulations, Precursors and Methods of Use Thereof, filed on Oct. 8, 2009.

* cited by examiner

*Primary Examiner* — Sin J. Lee
(74) *Attorney, Agent, or Firm* — Karen Canaan; CanaanLaw, P.C.

(57) ABSTRACT

The present invention provides chemically amplified silsesquioxane polymers for preparing masks using e-beam lithography. The silsesquioxane polymers have reactive sidechains that in the presence of an acid undergo acid catalyzed rearrangement to generate reactive functionalities that crosslink to form Si—O—Si bonds. The reactive side-chains comprise β- and γ-substituted alkyl groups bound to the silicon of the silsesquioxane polymer. The substituent of the β- and γ-substituted alkyl group is an electron withdrawing group. Resists generated with the chemically amplified silsesquioxane polymers of the present invention and imaged with e-beams have resolution of ≦60 nm line/space.

12 Claims, 6 Drawing Sheets

CHEMICALLY AMPLIFIED SILSESQUIOXANE RESIST COMPOSITIONS

TECHNICAL FIELD

The present invention relates generally to photoresist compositions. More specifically, the present invention relates to chemically amplified silsesquioxane resist compositions and their use in electron beam (e-beam) lithography to fabricate masks.

BACKGROUND OF THE INVENTION

E-beam lithography using chemically amplified resists plays an important role in the fabrication of masks. The successful preparation of chemically amplified resists requires the optimization of at least the following parameters: resist formulation, speed of fabrication, film sensitivity, etch resolution, and line-edge roughness (LER).

Chemically amplified resists are typically spun on the top of a 15 nm Cr layer. In order to successfully transfer the pattern onto the metal layer, the chemically amplified resists must have good etch properties. The etch rate and isotropy or anisotropy of the film determine the required film thickness with higher etch rates requiring thicker resist films and lower etch rates being amenable to thinner resist films.

Resists that operate over a wide range of post exposure bake temperatures are preferred in the art; however, the critical dimensions (CD) should vary minimally with small temperature fluctuations.

SUMMARY OF THE INVENTION

In one embodiment, the present invention provides a chemically amplified resist composition comprising: (a) a silsesquioxane polymer having a structure of Formula (I), and (b) a photosensitive acid generator (PAG), (I)

wherein, $R^1$ is independently selected from the group consisting of alkyls, cycloalkyls, and aryl groups; $R^2$ is an electron withdrawing functionality independently selected from the group consisting of bromine, chlorine, iodine, acetoxy, substituted acetoxy, thioacetoxy, benzoyl, and substituted benzoyl, with the proviso that thioacetoxy is represented in the polymer; p is 1, 2, or 3; and m and n represent the mole percent of each repeating unit.

In another embodiment, the present invention provides a chemically amplified resist composition comprising: (a) a silsesquioxane polymer having a structure of Formula (I), and (b) a photosensitive acid generator (PAG), (I)

wherein, $R^1$ is independently selected from the group consisting of alkyls, cycloalkyls, and aryl groups; $R^2$ is an electron withdrawing functionality independently selected from the group consisting of bromine, chlorine, iodine, acetoxy, substituted acetoxy, thioacetoxy, benzoyl, and substituted benzoyl; p is at least 3; and m and n represent the mole percent of each repeating unit. In a preferred embodiment, p is 3, 4, or 5.

In a further embodiment, the present invention provides a method comprising: (a) forming onto a substrate a film comprising (i) a silsesquioxane polymer having a structure of Formula (I) and (ii) a photosensitive acid generator (PAG), and (b) patternwise imaging the film using an electron-beam (e-beam), wherein at least one region of the film is exposed to radiation and an acid catalyst is produced in the at least one exposed region of the film, (I)

wherein, $R^1$ is independently selected from the group consisting of alkyls, cycloalkyls, and aryl groups; $R^2$ is an electron withdrawing functionality independently selected from the group consisting of bromine, chlorine, iodine, acetoxy, substituted acetoxy, thioacetoxy, benzoyl, and substituted benzoyl; p is 1, 2, or 3; and m and n represent the mole percent of each repeating unit.

In one embodiment of the invention, $R^1$ is independently selected from the group consisting of methyl groups and ethyl groups.

In another embodiment of the invention, $R^2$—$(CH_2)_p$ is independently selected from the group consisting of acetoxyethyl groups and substituted acetoxyethyl groups.

In a further embodiment of the invention, the PAG is selected from the group consisting of (trifluoro-methylsulfonyloxy)-bicyclo[2.2.1]hept-5-ene-2,3-dicarboximide (MDT); N-hydroxy-naphthalimide (DDSN); onium salts; benzoin tosylate; t-butylphenyl α-(p-toluenesulfonyloxy)-acetate; t-butyl α-(p-toluenesulfonyloxy)-acetate; sulfonic acid esters of N-hydroxyamides, imides, or combinations thereof; nitrobenzyl esters; s-triazine derivatives; N-camphorsulfonyloxynaphthalimide; N-pentafluorophenylsulfonyloxynaphthalimide; ionic iodonium sulfonates; perfluoroalkanesulfonates; aryl triflates; pyrogallol derivatives; trifluoromethanesulfonate esters of hydroxyimides; α,α'-bis-sulfonyl-diazomethanes; sulfonate esters of nitro-substituted benzyl alcohols; naphthoquinone-4-diazides; and alkyl disulfones.

In a preferred embodiment, the PAG is triphenylsulfonium nonaflate.

In another embodiment of the invention, the silsesquioxane polymer is poly[methylsilsesquioxane-co-acetoxyethylsilsesquioxane].

In a further embodiment of the invention, the silsesquioxane polymer has a weight average molecular weight (MW) of about 400 to about 500,000 Daltons. In a preferred embodiment, the MW is from about 5000 to about 10,000 Daltons.

In another embodiment of the invention, the method further comprises the step of: (c) after imaging, baking the film, wherein the baking induces crosslinking in the at least one exposed region of the film and the crosslinking renders the at least one exposed region of the film insoluble in aqueous base.

In a further embodiment of the invention, the method further comprises the step of: (d) after baking, developing the film in a developer selected from an organic or aqueous solution, wherein the developing removes unexposed base-soluble regions of the film resulting in a relief pattern on the film. In a preferred embodiment, the developer is an alkaline aqueous solution.

In another embodiment of the invention, the method further comprises the step of: (e) after developing, curing the relief pattern.

Additional aspects and embodiments of the invention will be provided, without limitation, in the detailed description of the invention that is set forth below.

BRIEF DESCRIPTION OF THE DRAWINGS

(FIGS. 5A and 5C) and 93° C. (FIGS. 5B and 5D).

DETAILED DESCRIPTION OF THE INVENTION

Set forth below is a description of what are currently believed to be preferred embodiments of the claimed invention. Any alternates or modifications in function, purpose, or structure are intended to be covered by the claims of this application. As used in this specification and the appended claims, the singular forms "a," "an," and "the" include plural referents unless the context clearly dictates otherwise. The terms "comprises" and/or "comprising," as used in this specification and the appended claims, specify the presence of stated features, steps, elements, materials, and/or groups, but do not preclude the presence or addition of one or more other features, steps, elements, materials, and/or groups thereof.

The present invention provides a method and composition for creating patterns with e-beam lithography using a negative tone resist formulation comprising silsesquioxane polymers with reactive sidechains that in the presence of an acid undergo acid catalyzed rearrangement to generate reactive functionalities that crosslink to form Si—O—Si bonds. The reactive side-chains comprise β- and γ-substituted alkyl groups bound to the silicon of the silsesquioxane polymer. The substituent of the β- and γ-substituted alkyl group is an electron withdrawing group.

In a preferred embodiment of the present invention, the β-substituted sidechain of the silsesquioxane polymer is an acetoxyethyl functionality. An advantage of acetoxyethyl groups over other silsesquioxane groups is long term stability of the resin. For example, the slow condensation of silanols over time presents long-term stability issues. The acetoxyethyl groups of the present invention overcome the known stability issue of silanols. In addition to the foregoing, acetoxyethyl groups have at least the following two properties: (i) the formation of Si—O—Si bonds in the presence of a photogenerated acid; and (ii) solubility in standard aqueous developers.

As shown in the following reaction, acetoxyethyl groups undergo chemically-amplified crosslinking in the presence of a photosensitive acid generator (PAG) to form Si—O—Si bonds.

As shown in the following reaction, acetoxyethyl group undergo a rearrangement to generate silanols rendering the polymers soluble in standard aqueous developer (e.g., 0.26 N TMAH).

It is important to note that the chemically amplified polymers of the present invention are not limited to silsesquioxanes with acetoxyethyl functionalities and that other silsesquioxanes with β- and γ-substituted electron withdrawing groups can exhibit the same behavior as the acetoxyethyl substituted polymers.

In one embodiment of the present invention, the silsesquioxane polymer is a linear, branched, caged compound, or combination thereof having the structure of Formula (I):

Formula (I)

wherein $R^1$ is independently selected from the group consisting of alkyls, cycloalkyls, and aryl groups; $R^2$ is an electron withdrawing functionality independently selected from the group consisting of bromine, chlorine, iodine, acetoxy, substituted acetoxy, thioacetoxy, benzoyl, and substituted benzoyl, with the proviso that thioacetoxy is represented in the polymer; p is 1, 2, or 3; and m and n represent the mole percent of each repeating unit.

In another embodiment of the present invention, the silsesquioxane polymer is a linear, branched, caged compound, or combination thereof having the structure of Formula (I):

Formula (I)

wherein $R^1$ is independently selected from the group consisting of alkyls, cycloalkyls, and aryl groups; $R^2$ is an electron withdrawing functionality independently selected from the group consisting of bromine, chlorine, iodine, acetoxy, substituted acetoxy, thioacetoxy, benzoyl, and substituted benzoyl; p is at least 3; and m and n represent the mole percent of each repeating unit. In a preferred embodiment, p is 3, 4, or 5.

The $R^1$ and $R^2$ proportions and structures are selected to provide a material suitable for e-beam lithographic processes. In preferred embodiments of the invention, $R^1$ is independently selected from the group consisting of methyl groups and ethyl groups and $R^2$—$(CH_2)_p$ is independently selected from the group consisting of acetoxyethyl groups and substituted acetoxyethyl groups.

In another embodiment of the invention, the silsesquioxane polymers of the present invention have a weight averaged molecular weight (MW) of about 400 to 500,000 Daltons, preferably from about 5,000 to 10,000 Daltons.

In a further embodiment of the invention, the resist composition further comprises a PAG. Upon exposure to radiation, PAGs generate a strong acid. Generally, the PAGs have a high thermal stability, particularly to temperatures greater than 140° C. so they are not degraded during pre-exposure processing. The photosensitive acid generator can be miscible with the polymers.

Examples of PAGs include, without limitation, (trifluoromethylsulfonyloxy)-bicyclo[2.2.1]hept-5-ene-2,3-dicarboximide (MDT); N-hydroxy-naphthalimide (DDSN); onium salts; benzoin tosylate; t-butylphenyl α-(p-toluenesulfonyloxy)-acetate; t-butyl α-(p-toluenesulfonyloxy)-acetate; and sulfonic acid esters of N-hydroxyamides, imides, or combinations thereof. Onium salts include, without limitation, halogen complex anions of divalent to heptavalent metals or non-metals, for example, Sb, B, P, and As. Other examples of onium salts include aryl-diazonium salts, halonium salts, aromatic sulfonium salts, aromatic sulfoxonium salts, and selenium salts (e.g., triarylsulfonium and diaryliodonium hexafluoroantimonates, hexafluoroarsenates, and trifluoromethanesulfonates).

Other PAGs include, without limitation, the family of nitrobenzyl esters and the s-triazine derivatives. S-triazine acid generators are disclosed, for example, in U.S. Pat. No. 4,189,323 to Buhr. Other acid generators include, without limitation, N-camphorsulfonyloxynaphthalimide; N-pentafluorophenylsulfonyloxynaphthalimide; ionic iodonium sulfonates, e.g., diaryl iodonium (alkyl or aryl) sulfonate and bis-(di-t-butylphenyl)iodonium camphanylsulfonate; perfluoroalkanesulfonates, such as perfluoropentanesulfonate, perfluorooctanesulfonate, perfluoromethanesulfonate; aryl (e.g., phenyl or benzyl) triflates and derivatives and analogs thereof, e.g., triphenylsulfonium triflate or bis-(t-butylphenyl)iodonium triflate; pyrogallol derivatives (e.g., trimesylate of pyrogallol); trifluoromethanesulfonate esters of hydroxyimides; α,α'-bis-sulfonyl-diazomethanes; sulfonate esters of nitro-substituted benzyl alcohols; naphthoquinone-4-diazides; and alkyl disulfones. Other PAGs in addition to those described above are disclosed in Reichmanis et al., CHEMISTRY OF MATERIALS 3:395-399 (1991) and in U.S. Pat. No. 5,679,495 to Yamachika et al. Additional PAGs suitable for use with the compositions and methods of the present invention will be known to those skilled in the art and/or are described in the pertinent literature.

The photopatternable low-k composition of the present invention may further comprise a casting solvent to dissolve the other components. The casting solvent may be used to prepare a film of the composition. Suitable casting solvents may comprise solvents such as ethoxyethylpropionate (EEP); a combination of EEP and γ-butyrolactone; propylene-glycol monomethylether alcohol and acetate; propyleneglycol monopropyl alcohol and acetate; ethyl lactate; or combinations thereof.

In a preferred embodiment of the invention, a film comprising the chemically amplified silsesquioxane polymer of the present invention is formed onto a substrate and the film is patternwise imaged through a mask, wherein at least one region of the film is exposed to radiation and an acid catalyst is produced in the at least one exposed region of the film.

After imaging, the film may be baked, wherein the baking induces crosslinking in the at least one exposed region of the film and the crosslinking renders the at least one exposed region of the film insoluble in aqueous base.

Figure 3:
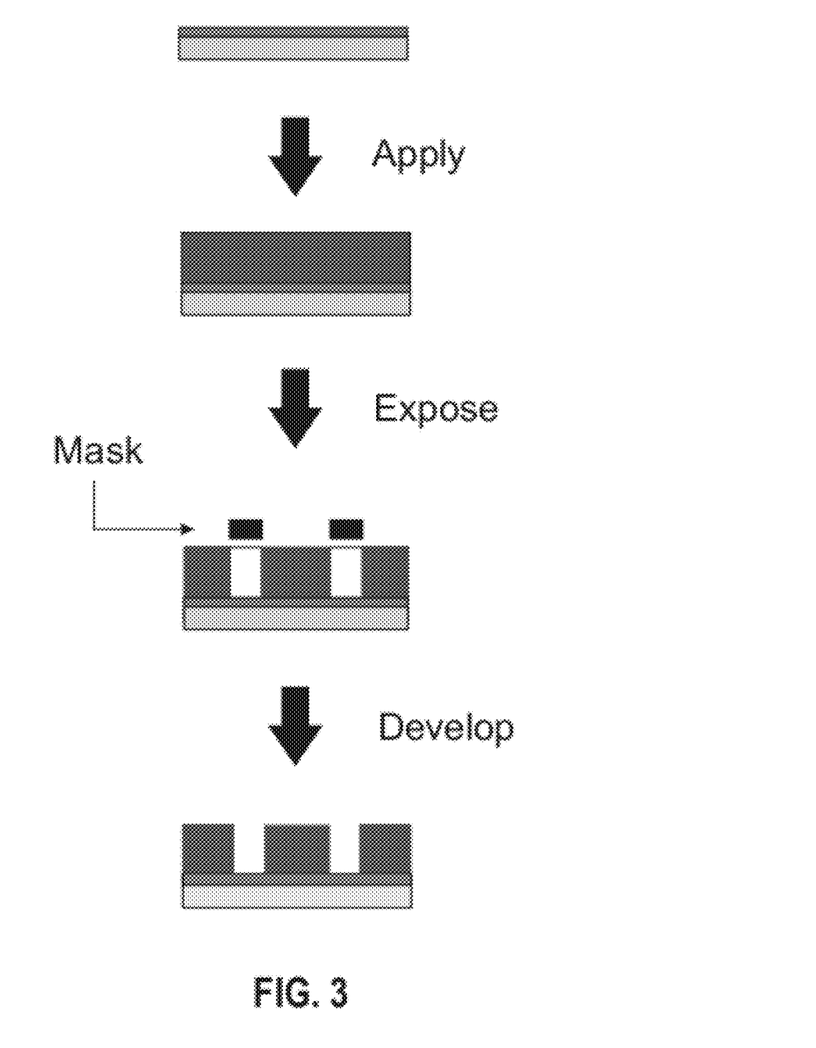
FIG. 3 is a schematic of the bake/exposure/development masking method of the present invention.
Figure 4A:
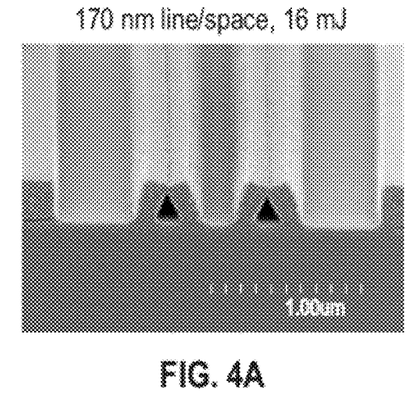
FIGS. 4A-4D show scanning electron microscope (SEM) photographs of four resists prepared using the 60:40 pMSSQ/AESSQ copolymer of the present invention and imaged on a 193 nm stepper.
Figure 4B:
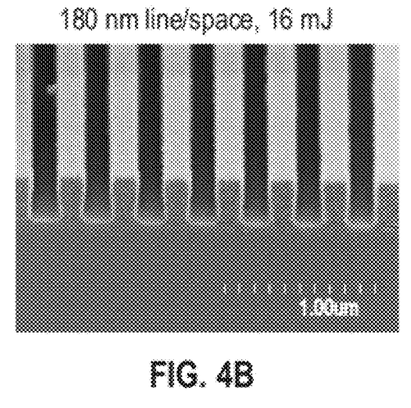
Figure 4C:
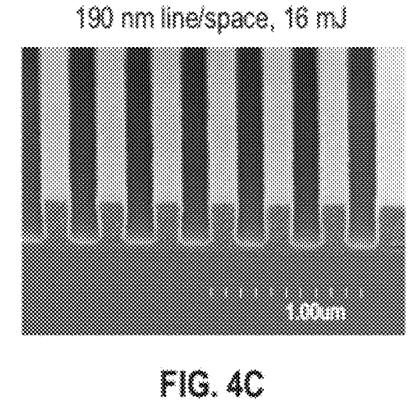
Figure 4D:
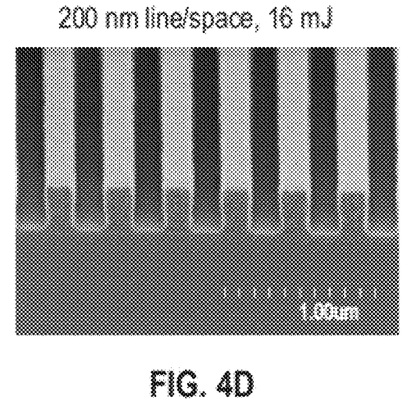

After baking, the film may be developed in an aqueous or organic solution, wherein the developing removes unexposed base-soluble regions of the film resulting in a relief pattern on the film. In a preferred embodiment, the developer is an alkaline aqueous solution, such as 0.13, 0.2, or 0.26 N TMAH. Preferably, the polymers of the present invention are soluble in 0.26 N TMAH. FIG. 3 provides a schematic of the bake/exposure/development masking method of the present invention.

After the development step, the relief pattern may be cured to induce further crosslinking of the material. In one embodiment of the invention, the relief pattern may be baked at a temperature of about 35° C. to 1000° C., preferably from about 100° C. to 500° C. In another embodiment of the invention, the resist composition may further include an organic base. The base may be any suitable base known in the resist arts. Examples of base additives include: dimethylamino pyridine; 7-diethylamino-4-methyl coumarin; tertiary amines; proton sponge; and polymeric amines, such as the PLURONIC® or TETRONIC® series available from BASF (New Jersey, USA). Tetraalkyl ammonium hydroxides or cetyltrimethyl ammonium hydroxide may be used as a base additive when the PAG is an onium salt.

Figure 2:
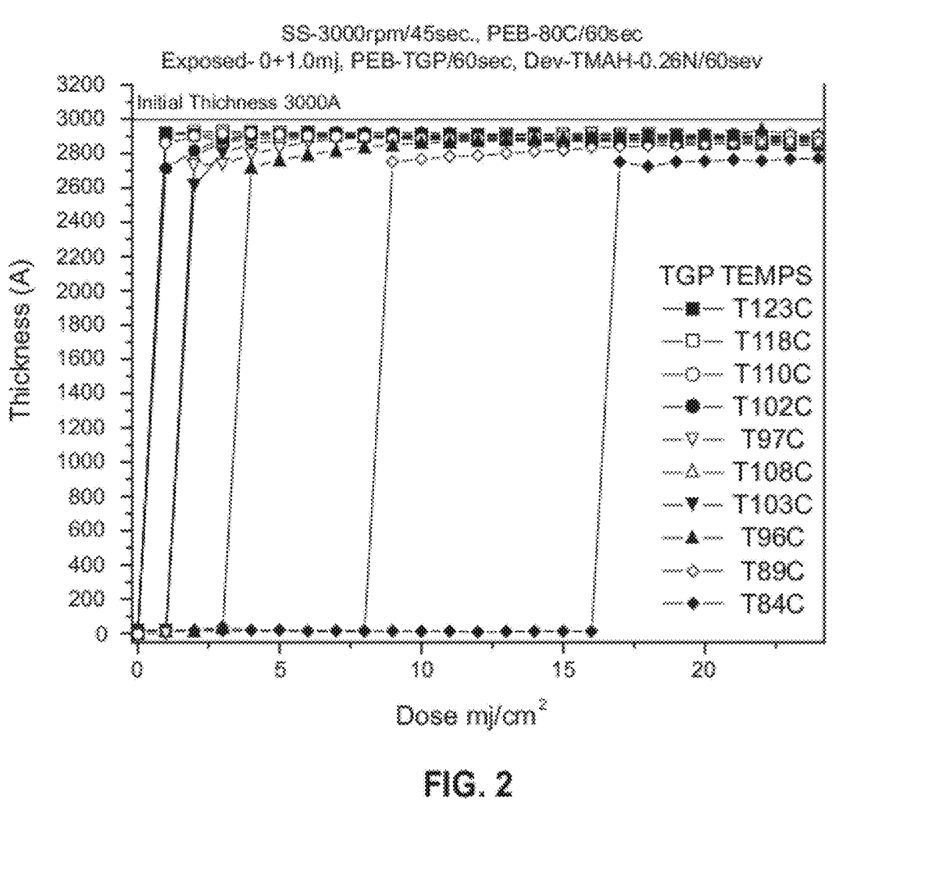
FIG. 2 is a graph that shows the contrast curves of the 60:40 pMSSQ/AESSQ copolymer of the present invention using thermographic phosphor (TGP) fluorescence imaging on a 193 nm stepper.

Optionally, for larger mask features, 193 nm wavelength light may be used to image the resist composition to form the patterned film. FIG. 2 shows contrast curves on a thermal gradient plate for a 60:40 PMSSQ/AESSQ copolymer prepared according to the method of the present invention (see, Example 1) using TGP fluorescence imaging on a 193 nm stepper. FIGS. 4A-4D show SEM images of four patterned resists generated with a 60:40 PMSSQ/AESSQ copolymer of the present invention after 193 nm imaging with a PAB of 100° C. for 60 seconds and a PEB of 90° C. for 60 seconds. As shown therein, the resists produced resolution at 180 nm line/space (and 190 and 200 nm line/space), but not at 170 nm line/space.

Figure 5A:
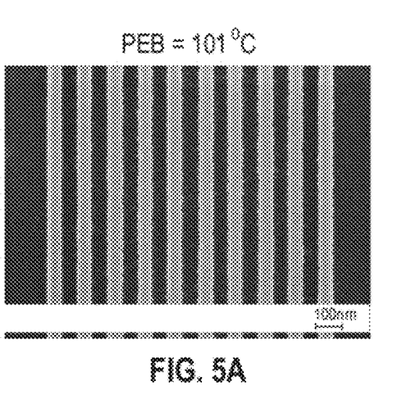
FIGS. 5A-5D show SEM photographs of two resists prepared using the 60:40 pMSSQ/AESSQ copolymer of the present invention and imaged using e-beam lithography with post-exposure bake (PEB) temperatures of 101° C.
Figure 5B:
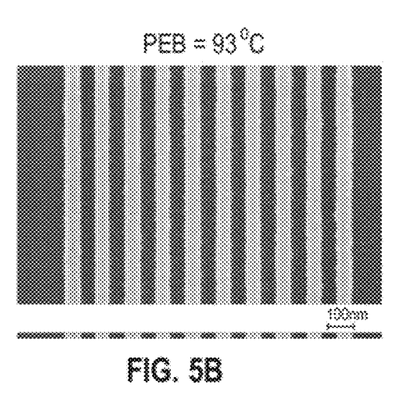
Figure 5C:
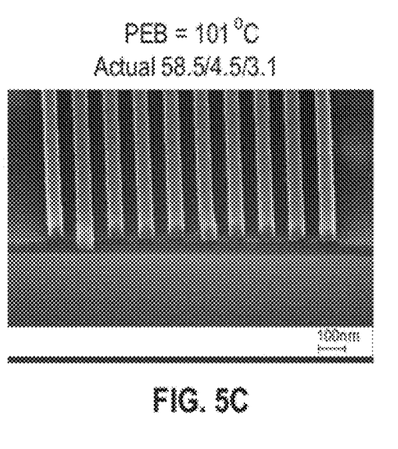
Figure 5D:
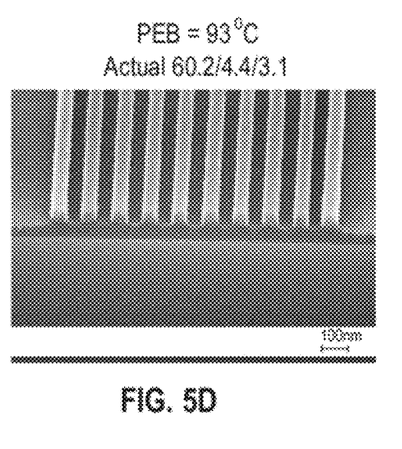

In a further embodiment of the invention, an e-beam may be used to image the resist composition to form a patterned film with high resolution. FIGS. 5A and 5C show SEM images of patterned resist compositions generated with 60:40 PMSSQ/AESSQ copolymers of the present invention after e-beam imaging and a PEB temperature of 101° C. for 60 seconds. FIGS. 5B and 5D show SEM images of patterned resist compositions generated with 60:40 PMSSQ/AESSQ copolymers of the present invention after e-beam imaging and a PEB temperature of 93° C. for 60 seconds. As shown therein, fine resist features of 60 nm line/space were printed with low LER (~3.1) and no residual material remaining between the patterned features.

The chemically amplified resists of the present invention provide high resolution, high sensitivity, and good profile control for generating patterns for use in mask fabrication. The increased silicon content of the resists of the present invention improves the etch contrast between the patterned layer and the underlying substrate.

It is to be understood that while the invention has been described in conjunction with the embodiments set forth above, the foregoing description as well as the examples that follow are intended to illustrate and not limit the scope of the invention. Further, it is to be understood that the embodiments and examples set forth herein are not exhaustive and that modifications and variations of the invention will be apparent to those of ordinary skill in the art without departing from the scope and spirit of the invention.

All patents and publications mentioned herein are incorporated by reference in their entireties.

EXPERIMENTAL

The following examples are set forth to provide those of ordinary skill in the art with a complete disclosure of how to make and use the aspects and embodiments of the invention as set forth herein. While efforts have been made to ensure accuracy with respect to variables such as amounts, temperature, etc., experimental error and deviations should be taken into account. Unless indicated otherwise, parts are parts by weight, temperature is degrees centigrade, and pressure is at or near atmospheric. All components were obtained commercially unless otherwise indicated.

Where appropriate, the following techniques and equipment were used in the following examples. $^1$H and $^{13}$C NMR spectra were obtained at room temperature on an Avance 400 spectrometer. Quantitative $^{13}$C NMR was run at room temperature in acetone-$d_6$ in an inverse-gated $^1$H-decoupled mode using $Cr(acac)_3$ as a relaxation agent on an Avance 400 spectrometer. Molecular weights were measured in tetrahydrofuran (THF) on a Waters Model 150 chromatograph relative to polystyrene standards. IR spectra were recorded on a Nicolet 510 FT-IR spectrometer on a film cast on a KBr plate. Film thickness was measured on a Tencor alpha-step 2000. A quartz crystal microbalance (QCM) was used to study the dissolution kinetics of the resist films in an aqueous TMAH solution (CD-26). A Leica VB6 VISTEC tool at 100 keV and a current of 0.5 nA/cm$^2$ was used; the tool has a nominal spot size of 12 nm. The patterns were generated with LEDIT, converted to gds format, and finally fragmented by CATS into a file readable by the pattern generator.

EXAMPLE 1

Synthesis of Poly[Methylsilsesquioxane-Co-Acetoxyethylsilsesquioxane] (60:40 PMSSQ/AESSQ Copolymer)

A 250 milliliter (mL) three neck round-bottom flask equipped with a thermocouple thermometer, magnetic stirrer, condenser with nitrogen inlet, and a temperature controlled heating mantle was charged with a mixture of triethoxymethylsilane (21.39 grams, 0.12 mole), acetoxyethyltriethoxysilane (20.02 g, 0.08 mole), and 50 grams of methyl isobutyl ketone. The mixture was heated with stirring under nitrogen, and 15 mL of a 1.75 wt % solution of oxalic acid in water was added to the mixture at 80° C. The reaction mixture was initially inhomogeneous, but became homogeneous after 15 minutes of stirring. The homogenization of the reaction mixture was accompanied by an exothermic reaction leading to an increase in temperature to around 100° C. The temperature was brought down to 80° C. and the mixture was stirred for a total of 6 hours. Thereafter, the mixture was cooled to room temperature and diluted with 150 mL of ethyl acetate. This mixture was extracted with eight 100 mL portions of deionized water (final water extract was almost neutral to pH paper). The organic layer was evaporated to yield ~20 grams of foam after evacuation under high vacuum at 298 K for 24 hours.

Figure 1A:
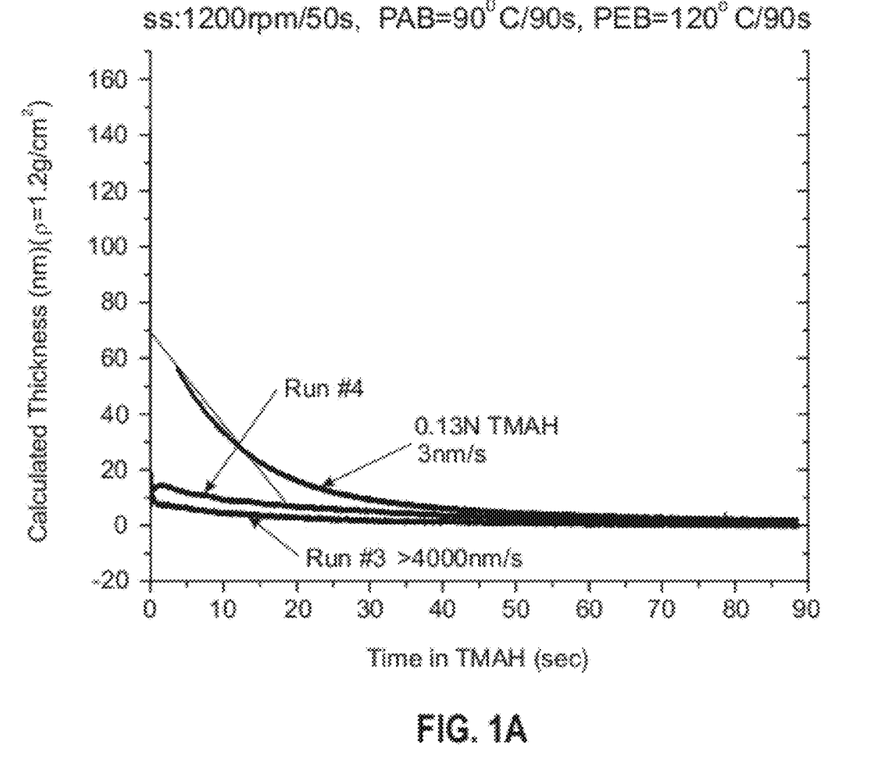
FIG. 1A is a graph that shows the dissolution rate of a 60:40 poly[methylsilsequioxane-co-acetoxyethylsilsequioxane] (pMSSQ/AESSQ) copolymer of the present invention in tetramethyl ammonium hydroxide (TMAH) developer over a period of 90 seconds.
Figure 1B:
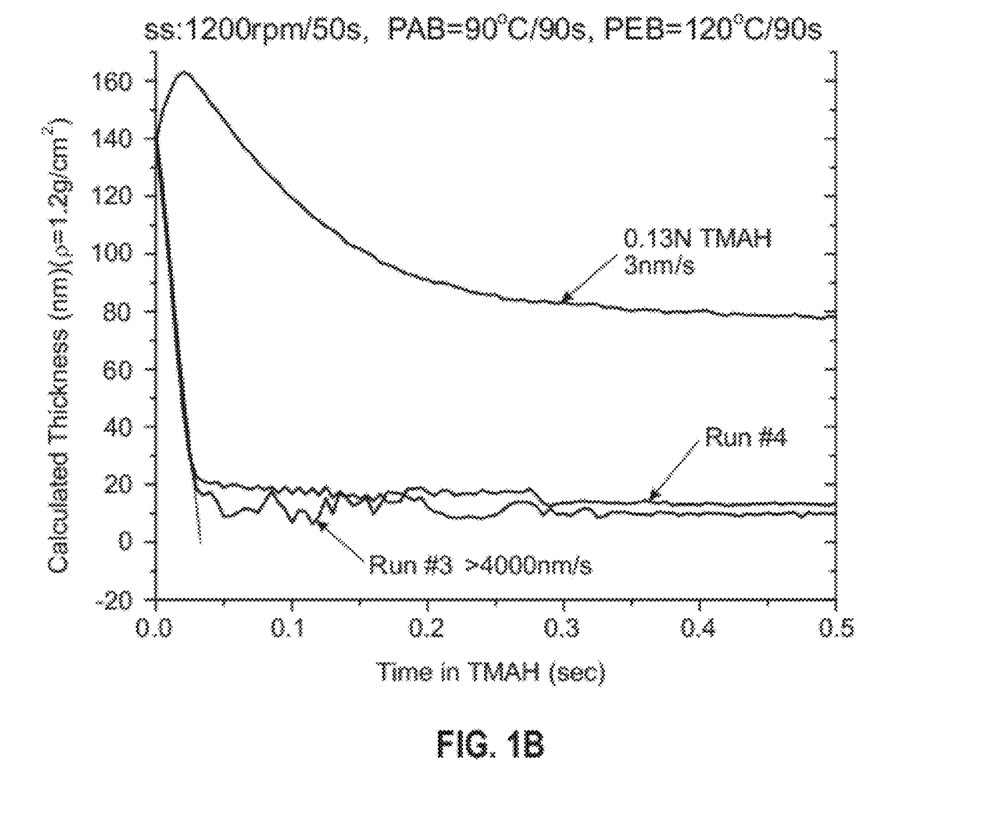
FIG. 1B is a close-up representation of 0-0.5 seconds of the graph of FIG. 1B.

FIGS. 1A and 1B show the dissolution rate of 60:40 PMSSQ/AESSQ copolymers of the present invention in TMAH developer as determined by QCM measurements. The polymers were coated onto a QCM wafer using a spin speed (ss) of 1200 rpm for 50 seconds. The wafers were then post-applied baked (PAB) and then simulated post-exposure baked (PEB) at 90° C. and 120° C., respectively, for 90 seconds. The polymer films were exposed to 0.26 N TMAH developer (Run #3 and Run #4) or 0.13 N TMAH developer, and the dissolution rate determined. The polymer film dissolved at a rate of >4000 nm/s in 0.26 N TMAH and 3 nm/s in 0.13 N TMAH.

EXAMPLE 2

Synthesis of Poly[Methylsilsesquioxane-Co-Acetoxyethylsilsesquioxane] (80:20 PMSSQ/AESSQ Copolymer)

A 250 mL three neck round-bottom flask equipped with a thermocouple thermometer, magnetic stirrer, condenser with nitrogen inlet, and a temperature controlled heating mantle was charged with a mixture of triethoxymethylsilane (28.52 grams, 0.16 mole), acetoxyethyltriethoxysilane (10.01 g, 0.04 mole), and 50 grams of methyl isobutyl ketone. The mixture was heated with stirring under nitrogen, and 15 mL of a 1.75 wt % solution of oxalic acid in water was added to the mixture at 80° C. The reaction mixture was initially inhomogeneous, but became homogeneous after 15 minutes of stirring. The homogenization of the reaction mixture was accompanied by an exothermic reaction leading to an increase in temperature to around 100° C. The temperature was brought down to 80° C. and the mixture was stirred for a total of 6 hours. Thereafter, the mixture was cooled to room temperature and diluted with 150 mL of ethyl acetate. This mixture was extracted with eight 100 mL portions of deionized water (final water extract was almost neutral to pH paper). The organic layer was evaporated to yield ~20 grams of foam after evacuation under high vacuum at 298 K for 24 hours.

EXAMPLE 3

E-Beam Resist Composition (60:40 PMSSQ/AESSQ Copolymer)

A negative tone resist composition was formulated with 5 g of a 5 wt % solution of 60:40 pMSSQ/AESSQ copolymer (Example 1) in propylene glycol monomethyl ether acetate (PGMEA) and 3 pts of a 20 wt % solution of triphenylsulfonium nonaflate (TPSN) in PGMEA. The resulting formulation was filtered through a 0.2 micron (μm) filter.

The formulation was spin coated (30 seconds at 2000 rpm) onto a 5-inch silicon wafer pre-coated with DUV42P (63 nm thick) (Brewer Science, Inc., Rolla, Mo., USA) and then post-applied baked (PAB) at 80° C. for 60 seconds (s). The baked film was exposed to e-beam irradiation of 160 microCoulombs per centimeter squared (160 μC/cm$^2$) to generate a latent image and post exposure baked (PEB) at 101° C. or 93° C. for 60 s, and then developed using a TMAH CD-26 aqueous developer for 60 s. The e-beam patterning process generated 60 nm lines with 120 nm pitch at a radiant energy dose of 160 μC/cm$^2$.

FIGS. 5A-5D are SEM images of resists generated with the 60:40 pMSSQ/AESSQ copolymers described above using e-beams. FIGS. 5A and 5C show 60 nm line and space resolution for resists generated with a PEB of 101° C. (actual 58.5 nm, LWR=4.5, LER=3.1) and FIGS. 5B and 5D show 60 nm line and space resolution for resists generated with a PEB of 93° C. (actual 60.2 nm, LWR=4.4, LER=3.1).

By contrast, FIGS. 4A-4D are SEM images of resists generated with the 60:40 pMSSQ/AESSQ copolymers described above using a 193 nm stepper for imaging, a PAB of 100° C. for 60 seconds, and a PEB of 90° C. for 60 seconds. As shown in FIGS. 4A-4D, line and space resolution was seen at 180 nm (and 190 and 200 nm), but at 170 nm, the line and space patterns collapsed.

EXAMPLE 4

E-Beam Resist Composition (80:20 PMSSQ/AESSQ Copolymer)

A patternable low-k composition was formulated with 100 g of a 5 wt % solution of 80:20 PMSSQ/AESSQ copolymer (Example 2) in PGMEA, 2 g of a 20 wt % solution of TPSN in PGMEA, and 2 g of a 0.5 wt % solution of an organic base, such as trioctylamine in PGMEA. The resulting patternable resist composition was filtered through a 0.2 μm filter.

The patternable resist composition was spin coated (30 seconds at 2000 rpm) onto an 8-inch silicon wafer pre-coated with DUV42P (63 nm thick) (Brewer Science, Inc., Rolla, Mo., USA) to produce a film of approximately 0.1 μm. The wafer and film were post-applied baked (PAB) at about 80° C. for about 60 s, pattern-wise exposed to an e-beam, and then post exposure baked (PEB) at 101° C. for 60 s. This was followed by two 30 s puddle development steps with 0.26 N TMAH developer.

We claim:
1. A method comprising,
   (a) forming onto a substrate a film comprising:
      (i) a silsesquioxane polymer having a structure of Formula (I),

(I)
wherein,
R$^1$ is independently selected from the group consisting of alkyls, cycloalkyls, and aryl groups;
R$^2$ is an electron withdrawing functionality independently selected from the group consisting of bromine, chlorine, iodine, acetoxy, substituted acetoxy, thioacetoxy, benzoyl, and substituted benzoyl;
p is 1, 2, or 3; and
m and n represent the mole percent of each repeating unit; and
      (ii) a photosensitive acid generator (PAG);
   (b) patternwise imaging the film using an electron-beam (e-beam), wherein at least one region of the film is exposed to radiation and an acid catalyst is produced in the at least one exposed region of the film;
   (c) baking the imaged film; and
   (d) developing the baked film, wherein the developing removes unexposed base-soluble regions of the film resulting in a relief pattern on the film.

2. The method of claim 1, wherein R$^1$ is independently selected from the group consisting of methyl groups and ethyl groups.

3. The method of claim 1, wherein R$^2$—(CH$_2$)$_p$ is independently selected from the group consisting of acetoxyethyl groups and substituted acetoxyethyl groups.

4. The method of claim 1, wherein the PAG is selected from the group consisting of (trifluoro-methylsulfonyloxy)-bicyclo[2.2.1]hept-5-ene-2,3-dicarboximide (MDT); N-hydroxy-naphthalimide (DDSN); onium salts; benzoin tosylate; t-butylphenyl α-(p-toluenesulfonyloxy)-acetate; t-butyl α-(p-toluenesulfonyloxy)-acetate; sulfonic acid esters of N-hydroxyamides, imides, or combinations thereof; nitrobenzyl esters; s-triazine derivatives; N-camphorsulfonyloxynaphthalimide; N-pentafluorophenylsulfonyloxynaphthalimide; ionic iodonium sulfonates; perfluoroalkanesulfonates; aryl triflates; pyrogallol derivatives;

trifluoromethanesulfonate esters of hydroxyimides; α,α'-bis-sulfonyl-diazomethanes; sulfonate esters of nitro-substituted benzyl alcohols; naphthoquinone-4-diazides; and alkyl disulfones.

5. The method of claim 4, wherein the PAG is triphenylsulfonium nonaflate.

6. The method of claim 1, wherein the silsesquioxane polymer is poly[methylsilsesquioxane-co-acetoxyethylsilsesquioxane].

7. The method of claim 1, wherein the silsesquioxane polymer has a weight average molecular weight (MW) of about 400 to about 500,000 Daltons.

8. The method of claim 7, wherein the MW is from about 5000 to about 10,000 Daltons.

9. The method of claim 1, wherein the baking of step (c) induces crosslinking in the at least one exposed region of the film and the crosslinking renders the at least one exposed region of the film insoluble in aqueous base.

10. The method of claim 1, wherein the developer of step (d) is selected from an organic or aqueous solution.

11. The method of claim 10, wherein the developer is an alkaline aqueous solution.

12. The method of claim 1, further comprising the step of:
  (e) after developing, curing the relief pattern.

* * * * *